(12) United States Patent
Chiu et al.

(10) Patent No.: US 9,455,322 B1
(45) Date of Patent: Sep. 27, 2016

(54) FLASH CELL AND FORMING PROCESS THEREOF

(71) Applicant: UNITED MICROELECTRONICS CORP., Hsin-Chu (TW)

(72) Inventors: Yi-Shan Chiu, Taoyuan (TW); Shen-De Wang, Hsinchu County (TW); Weichang Liu, Singapore (SG); Wei Ta, Singapore (SG); Zhen Chen, Singapore (SG); Wang Xiang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/862,118

(22) Filed: Sep. 22, 2015

(30) Foreign Application Priority Data

Aug. 25, 2015 (TW) .............................. 104127661 A

(51) Int. Cl.

| | |
|---|---|
| H01L 29/423 | (2006.01) |
| H01L 29/66 | (2006.01) |
| H01L 21/28 | (2006.01) |
| H01L 21/283 | (2006.01) |
| H01L 21/311 | (2006.01) |
| H01L 21/321 | (2006.01) |
| H01L 21/3213 | (2006.01) |
| H01L 29/788 | (2006.01) |
| H01L 27/115 | (2006.01) |
| H01L 29/51 | (2006.01) |

(52) U.S. Cl.
CPC ....... *H01L 29/42328* (2013.01); *H01L 21/283* (2013.01); *H01L 21/28273* (2013.01); *H01L 21/31111* (2013.01); *H01L 21/32115* (2013.01); *H01L 21/32133* (2013.01); *H01L 27/11521* (2013.01); *H01L 29/513* (2013.01); *H01L 29/518* (2013.01); *H01L 29/6656* (2013.01); *H01L 29/66825* (2013.01); *H01L 29/788* (2013.01)

(58) Field of Classification Search
CPC ................................................. H01L 29/42328
See application file for complete search history.

(56) References Cited

U.S. PATENT DOCUMENTS

| | | | |
|---|---|---|---|
| 8,076,207 B2 | 12/2011 | Kao | |
| 2008/0217675 A1* | 9/2008 | Liu | ................... H01L 21/28273 257/321 |

* cited by examiner

*Primary Examiner* — Daniel Shook
(74) *Attorney, Agent, or Firm* — Winston Hsu; Scott Margo

(57) ABSTRACT

A flash cell forming process includes the following steps. A first gate is formed on a substrate. A first spacer is formed at a side of the first gate, where the first spacer includes a bottom part and a top part. The bottom part is removed, thereby an undercut being formed. A first selective gate is formed beside the first spacer and fills into the undercut. The present invention also provides a flash cell formed by said flash cell forming process. The flash cell includes a first gate, a first spacer and a first selective gate. The first gate is disposed on a substrate. The first spacer is disposed at a side of the first gate, where the first spacer has an undercut at a bottom part, and therefore exposes the substrate. The first selective gate is disposed beside the first spacer and extends into the undercut.

20 Claims, 5 Drawing Sheets

FLASH CELL AND FORMING PROCESS THEREOF

BACKGROUND OF THE INVENTION

1. Field of the Invention

The present invention relates generally to a flash cell and a forming process thereof, and more specifically to a flash cell and a forming process thereof including rounding selective gates.

2. Description of the Prior Art

Microprocessor systems are able to handle data and arrange information and have become an important asset in information development of the highly developed modern information society. One of the most important structures in each kind of microprocessor system is the memory used to store digital data and to provide stored data for microprocessor systems. A flash memory or an EEPROM (electrically erasable programmable read only memory), thanks to electron operation, is able to store data in a non-volatile way and to read the stored data quickly and efficiently, unlike optical or magnetic storage media (such as discs or optical discs). Therefore, flash memories with light volumes and convenient and efficient operations have been utilized widely in various microprocessor systems, such as application chip systems, mobile phones, personal digital assistants, personal computers, digital cameras, etc.

A flash memory consists of MOS transistors with a floating gate, each serving as a memory cell for recording a bit data. A typical memory transistor in addition to a body, a drain, a source, and a control gate similar to a typical MOS transistor, has a floating gate. The floating gate is located in an oxide layer, isolated from the body, the drain, the source, and the control gate. When storing data, proper bias voltages are required to be applied to the gate, the source, the drain, and the body so that the electrons can pass through the oxide layer and thus flow into the floating gate. A different amount of charges injected into the floating gate of the transistor corresponds to different data. For instance, if more charges are injected into the floating gate, the transistor stores a data bit "1"; on the contrary, if less charges are injected into the floating gate, the transistor stores a data bit "0". The amount of charges injected into the floating gate will influence the threshold voltage of the transistor. The more negative charges are injected into the floating gate of the transistor, the smaller the absolute value of the threshold voltage of the transistor is. Under the circumstance of keeping the control voltage applied on the control gate, the more negative charge there is within the floating gate, the higher the conduct performance associated with the transistor is, so that the current between the source and drain of the transistor is greater. In other words, under the circumstance of keeping the control voltage applied on the control gate, the data bit stored in the transistor depends on the amount of conduct current in the transistor between its source and drain. While overwriting or erasing the original data stored in the memory transistor, the control gate, the body, the drain, and the source are still required to have proper bias voltages applied, causing the electrons within the floating gate to pass through the oxide layer and flow into other electrodes of the transistor.

SUMMARY OF THE INVENTION

The present invention provides a flash cell and a forming process thereof, which has a selective gate extending to a bottom part of a spacer, thereby rounding the selective gate and thus reducing circuit leakage of the selective gate.

The present invention provides a flash cell forming process including the following steps. A first gate is formed on a substrate. A first spacer is formed on a side of the first gate, wherein the first spacer includes a bottom part and a top part. The bottom part is removed, thereby forming an undercut. A first selective gate is formed beside the first spacer and fills into the undercut.

The present invention provides a flash cell including a first gate, a first spacer and a first selective gate. The first gate is disposed on a substrate. The first spacer is disposed on a side of the first gate, wherein the first spacer has an undercut at a bottom part, thereby exposing the substrate. The first selective gate is disposed beside the first spacer and extends to the undercut.

According to the above, the present invention provides a flash cell and a forming process thereof, which forms a first spacer on a side of a first gate; removes a bottom part of the first spacer, thus forming an undercut; and forms a first selective gate beside the first spacer and fills into the undercut. In this way, a rounding first selective gate is formed to prevent circuit leakage caused by the tip of the first selective gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
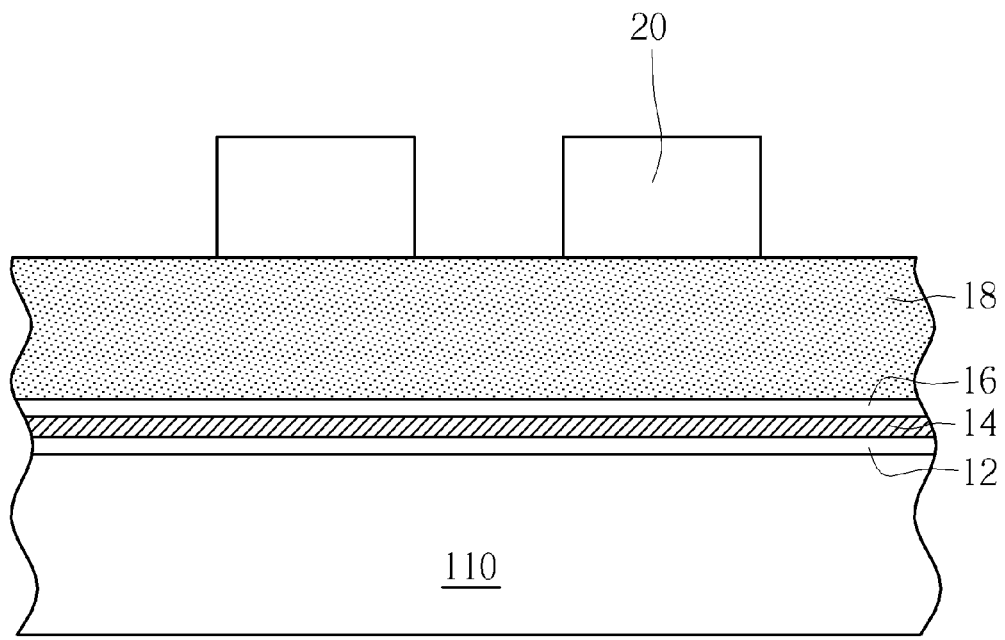
FIGS. 1-10 schematically depict cross-sectional views of a flash cell forming process according to an embodiment of the present invention.
Figure 2:
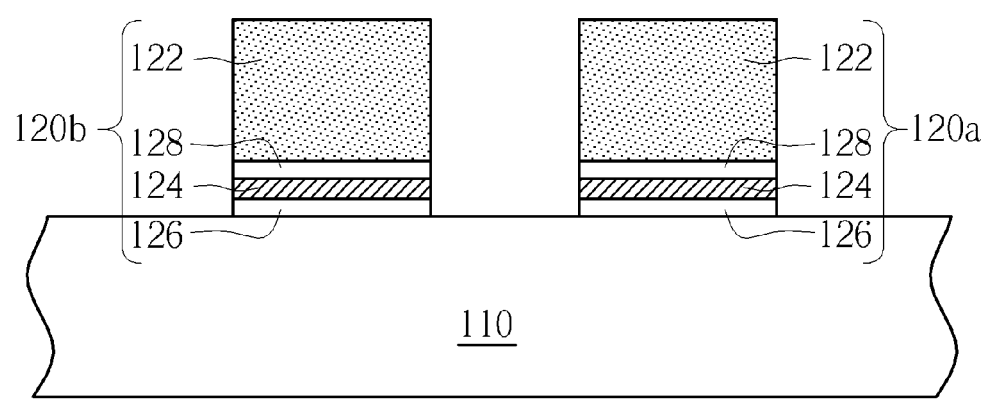

FIGS. 1-10 schematically depict cross-sectional views of a flash cell forming process according to an embodiment of the present invention. Please refer to FIGS. 1-2, a first gate 120a and a second gate 120b are formed on a substrate 110. As shown in FIG. 1, the substrate 110 is provided. The substrate 110 may be a semiconductor substrate such as a silicon substrate, a silicon containing substrate such as silicon carbide, a III-V group-on-silicon (such as GaN-on-silicon) substrate, a graphene-on-silicon substrate, a silicon-on-insulator (SOI) substrate or a substrate containing epitaxial layers such as a P-type substrate having a P-type epitaxial layer with a thickness of 2.5 micrometers. An oxide layer 12, a nitride layer 14, an oxide layer 16 and an electrode layer 18 sequentially cover the substrate 110. A photoresist (not shown) covers and is then patterned to form a patterned photoresist 20 on the electrode layer 18. The pattern of the patterned photoresist 20 is transferred to the electrode layer 18, the oxide layer 16, the nitride layer 14 and the oxide layer 12 to form the first gate 120a and the second gate 120b on the substrate 110. Then, the patterned photoresist 20 is removed, as shown in FIG. 2. Two gates are in this embodiment, but the number of the gates is not restricted thereto.

By doing this, the first gate 120a and the second gate 120b respectively include a control gate 122 formed by the patterned electrode layer 18 on the substrate, and a charge storage gate 124 formed by the patterned nitride layer 14 between the substrate 110 and the control gate 122. Moreover, the first gate 120a and the second gate 120b may respectively include a first dielectric layer 126 formed by the patterned oxide layer 12 between the charge storage gate 124 and the substrate 110, and a second dielectric layer 128 formed by the patterned oxide layer 16 between the charge storage gate 124 and the control gate 122. In this embodiment, the first dielectric layer 126, the charge storage gate 124 and the second dielectric layer 128 are formed by the oxide layer 12, the nitride layer 14 and the oxide layer 16, thereby the first dielectric layer 126, the charge storage gate 124 and the second dielectric layer 128 constitute an oxide/nitride/oxide layer, but it is not limited thereto. The control gate 122 may be composed of conductive materials such as polysilicon or other charge-trapping materials, but it is not limited thereto.

Figure 3:
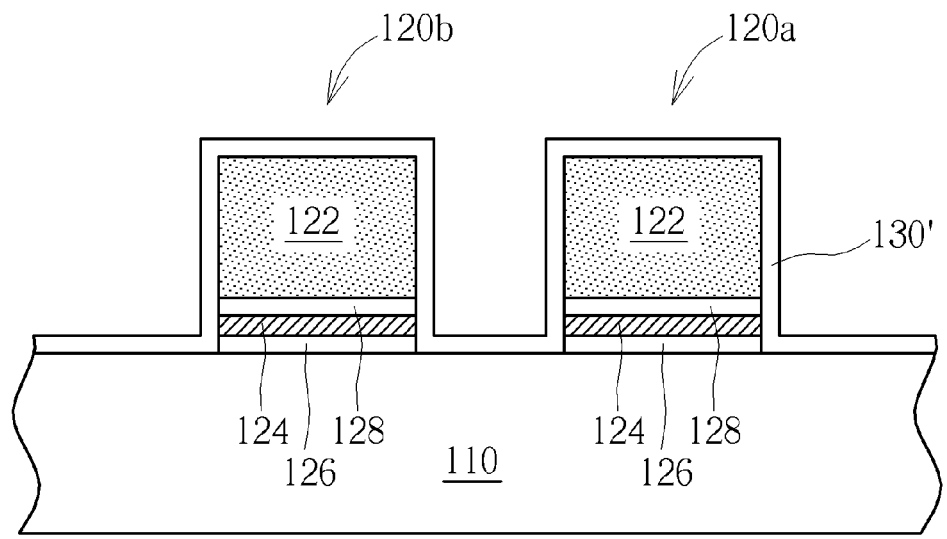
Figure 4:
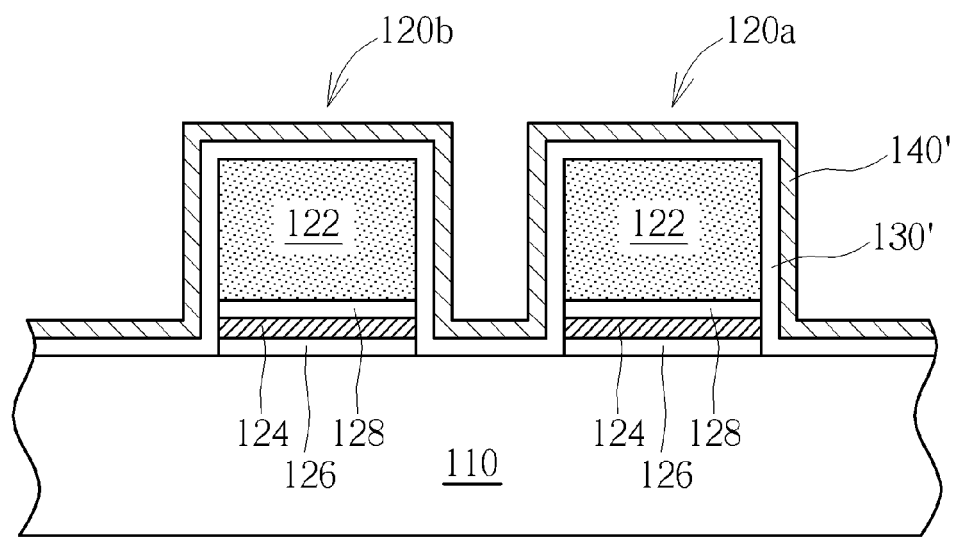
Figure 5:
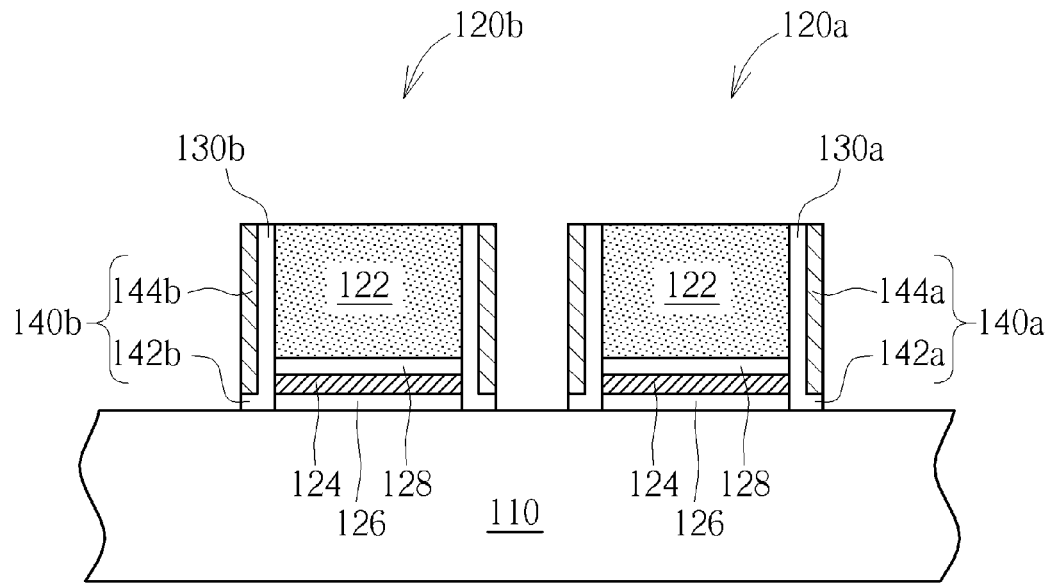

As shown in FIGS. 3-5, a first spacer 140a is formed on the substrate 110 beside the first gate 120a while a second spacer 140b is formed on the substrate 110 beside the second gate 120b. The first spacer 140a has a bottom part 142a and a top part 144a. The second spacer 140b has a bottom part 142b and a top part 144b.

More precisely, as shown in FIG. 3, an inner spacer material 130' may blanketly cover the first gate 120a, the second gate 120b and the substrate 110. As shown in FIG. 4, a first spacer material 140' may blanketly cover the inner spacer material 130'. It is emphasized that the inner spacer material 130' and the first spacer material 140' must be different materials, thereby a part of the inner spacer material 130' can be removed later by methods such as selective etching.

As shown in FIG. 5, the first spacer material 140' and the inner spacer material 130' are etched to form the first spacer 140a and the inner spacer 130a, the second spacer 140b and the inner spacer 130b, wherein the inner spacer 130a is located between the first gate 120a and the first spacer 140a, and the inner spacer 130b is located between the second gate 120b and the second spacer 140b. Specifically, the first spacer 140a has the bottom part 142a and the top part 144a, while the second spacer 140b has the bottom part 142b and the top part 144b.

The first spacer material 140' and the inner spacer material 130' may be etched by one single process, which has no etching selectivity to the first spacer material 140' and the inner spacer material 130'. This means the process has the same etching rate to the first spacer material 140' and the inner spacer material 130', so that the first spacer material 140' and the inner spacer material 130' can be etched simultaneously. In addition, the first spacer material 140' and the inner spacer material 130' may be formed by several etching processes to avoid over-etching or other problems.

Due to the inner spacer material 130' and the first spacer material 140' being formed sequentially and then etched simultaneously, the inner spacers 130a/130b and the bottom parts 142a/142b have materials of the inner spacer material 130', and the top parts 144a/144b have materials of the first spacer material 140'. Since the inner spacer material 130' and the first spacer material 140' must have different materials, the bottom parts 142a/142b and the top parts 144a/144b must have different materials. In one case, as the inner spacer material 130' includes oxide and the first spacer material 140' includes nitride, the top parts 144a/144b inherently include nitride and the bottom parts 142a/142b include oxide, but it is not limited thereto. It is noted that, the present invention must have the bottom part 142a/142b and the top part 144a/144b with different materials, but the forming methods are not restricted thereto.

In this embodiment, the first spacer material 140' is a single material layer, thus the first spacer 140a being a single layer and the second spacer 140b being a single layer, but it is not limited thereto. In another embodiment, the first spacer material 140' may be multilayers, thus the first spacer 140a being multilayers and the second spacer 140b being multilayers, depending upon practical requirements.

Figure 6:
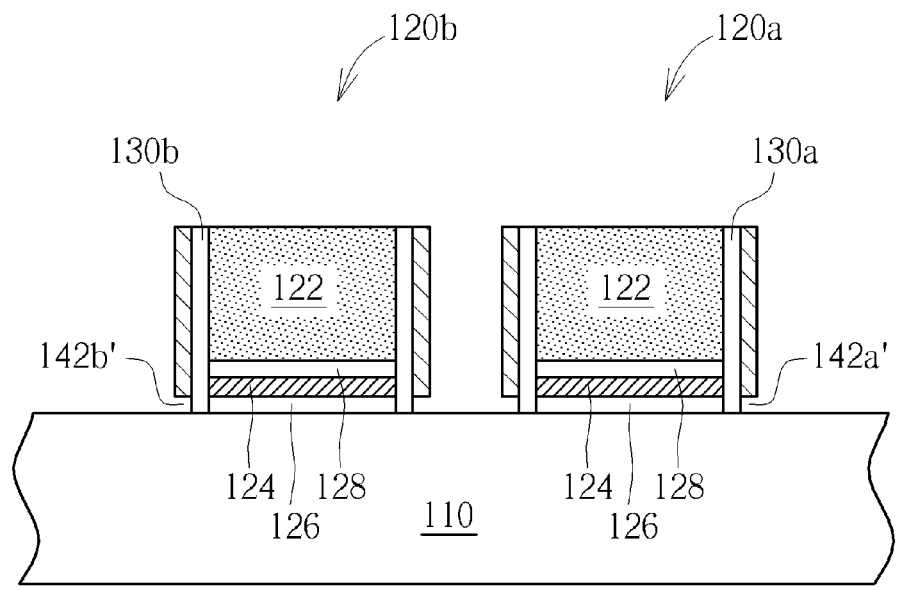

Then, the bottom parts 142a/142b are removed, thereby forming an undercut 142a' beside the first gate 120a, and an undercut 142b' beside the second gate 120b, and the corresponding parts of the substrate 110 are exposed, as shown in FIG. 6. Methods of removing the bottom parts 142a/142b may include performing a wet etching process containing dilute hydrofluoric acid (DHF), to remove the bottom parts 142a/142b composed of oxide, and preserve the top parts 144a/144b and the inner spacers 130a/130b, but it is not limited thereto. The inner spacers 130a/130b preferably remain completely or partially without being cut off, that leads to exposing the first gate 120a and the second gate 120b.

Please refer to FIGS. 7-10, a first selective gate 150a is formed beside the top part 144a of the first spacer 140a and fills into the undercut 142a' while a second selective gate 150b is formed beside the top part 144b of the second spacer 140b and fills into the undercut 142b', wherein the second selective gate 150b is located at a side of the second gate 120b opposite to the first gate 120a. Therefore, the first selective gate 150a contacts the inner spacer 130a, and the second selective gate 150b contacts the inner spacer 130b.

Figure 7:
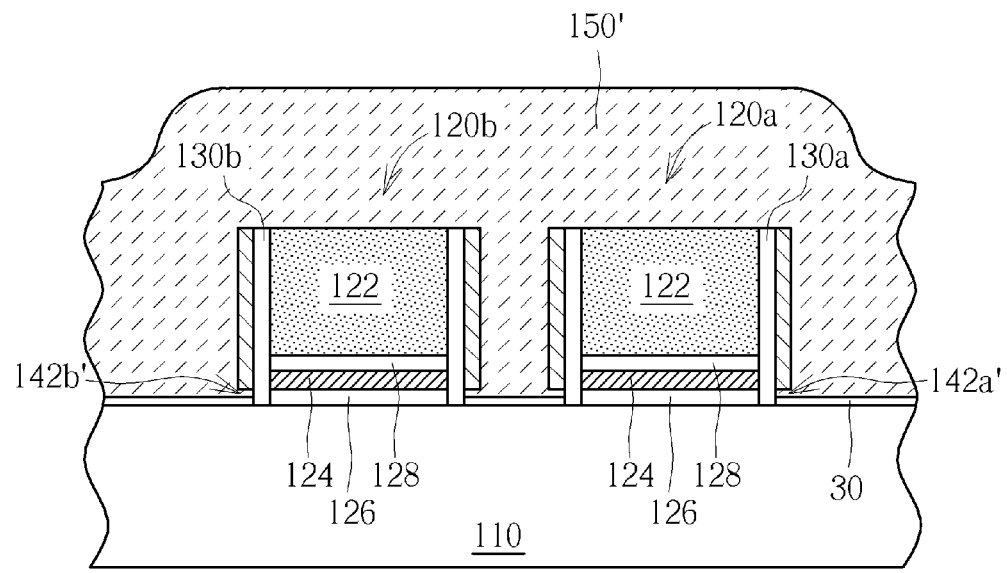

More precisely, as shown in FIG. 7, before the first selective gate 150a and the second selective gate 150b are formed, a gate dielectric layer 30 may be formed on the substrate 110 other than the first gate 120a and the second gate 120b, wherein the gate dielectric layer 30 may extend to the undercuts 142a'/142b' without filling it up. The gate dielectric layer 30 may be an oxide layer. In this case, the gate dielectric layer 30 is formed by a thermal process, thereby the gate dielectric layer 30 having a "—"-shaped cross-sectional profile, and only being formed on the substrate 110, but it is not restricted thereto. In other cases, the gate dielectric layer 30 may be formed by other processes such as a chemical oxide process, depending upon practical requirements.

A selective gate material 150' blanketly covers the first gate 120a, the second gate 120b and the substrate 110, and fills into the undercuts 142a'/142b'. The selective gate material 150' may be composed of polysilicon, but it is not limited thereto.

Figure 8:
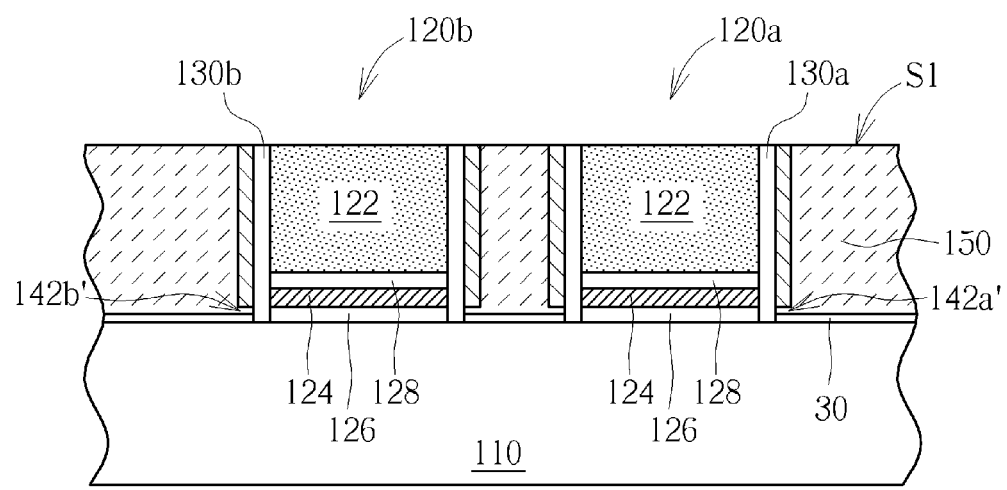

The selective gate material 150' is planarized until the first gate 120a and the second gate 120b are exposed, thereby a selective gate material 150 being formed, which has a flat top surface Si, as shown in FIG. 8. As the control gate 122 of the first gate 120a and the second gate 120b and the selective gate material 150' have common materials such as polysilicon, a cap layer (not shown) is preferably further formed on the control gate 122, wherein the cap layer can be a hard mask while patterning or etching, and be an etch stop layer while planarizing, but it is not limited thereto.

Figure 9:
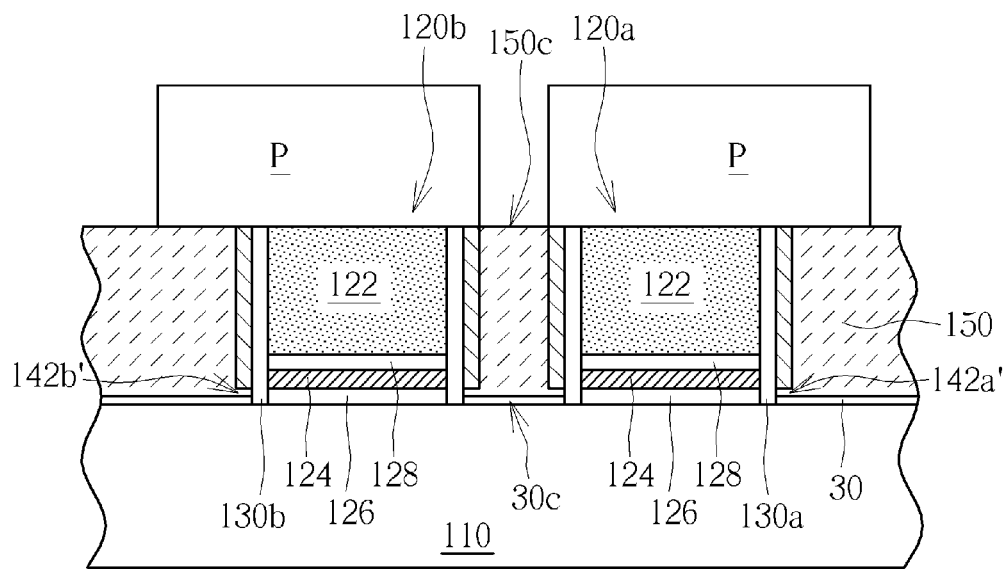
Figure 10:
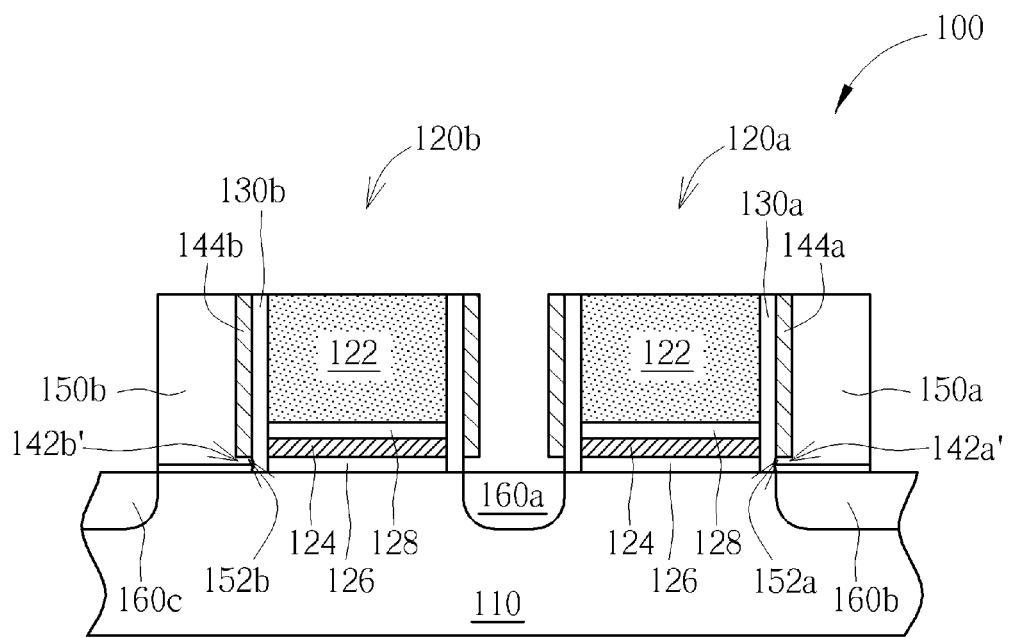

The selective gate material 150 is then patterned, thereby forming the first selective gate 150a and the second selective gate 150b, wherein the second selective gate 150b is at a side of the second gate 120b opposite to the first gate 120a, as shown in FIGS. 9-10. More precisely, as shown in FIG. 9, a photoresist (not shown) covers and is patterned to form a patterned photoresist P on the first gate 120a, the second gate 120b and a part of the selective gate material 150, but exposes a selective gate material 150c between the first gate 120a and the second gate 120b. Then, the selective gate material 150c between the first gate 120a and the second gate 120b and a part of the selective gate material 150 are removed, thereby forming the first selective gate 150a and the second selective gate 150b. Then, the patterned photoresist P is removed, as shown in FIG. 10. It is emphasized that, the first selective gate 150a and the second selective gate 150b both have protruding portions 152a/152b respectively extending into the undercuts 142a'/142b', thereby rounding the first selective gate 150a and the second selective gate 150b. As a result, circuit leakage caused by tip bottom parts of the first selective gate 150a and the second selective gate 150b can be avoided.

As shown in FIG. FIG. 10, an ion implantation process may be performed to form source/drains 160a/160b/160c beside the first gate 120a, the second gate 120b, the first selective gate 150a and the second selective gate 150b. In this embodiment, a common drain 160a is between the first gate 120a and the second gate 120b, but it is not limited thereto.

Two gates are in this embodiment, and the selective gate material 150c and the gate dielectric layer 30c between the first gate 120a and the second gate 120b are removed while the selective gate material 150 is patterned, but it is not limited thereto. For instance, only one gate may be applied in the present invention, and therefore the selective gate material 150 and the gate dielectric layer 30 other than the first selective gate 150a are removed while the selective gate material 150 is patterned.

Above all, a flash cell 100 can be formed by said flash cell forming process. The flash cell 100 may include the first gate 120a, the second gate 120b, the top part 144a of the first spacer 140a, the top part 144b of the second spacer 140b, the first selective gate 150a and the second selective gate 150b. The first gate 120a and the second gate 120b are disposed on the substrate 110. The top part 144a of the first spacer 140a is disposed at a side of the first gate 120a, while the top part 144b of the second spacer 140b is disposed at a side of the second gate 120b opposite to the first gate 120a. The undercuts 142a'/142b' are below the top part 144a of the first spacer 140a and the top part 144b of the second spacer 140b and the substrate 110 is exposed. The first selective gate 150a is disposed beside the top part 144a of the first spacer 140a and extends into the undercut 142a', and the second selective gate 150b is disposed beside the top part 144b of the second spacer 140b and extends into the undercut 142b'.

To summarize, the present invention provides a flash cell and a forming process thereof, which forms a first spacer on a side of a first gate; removes a bottom part of the first spacer, thus forming an undercut; and forms a first selective gate beside the first spacer and filling the undercut. In this way, a rounding first selective gate is formed to prevent circuit leakage caused by the tip of the first selective gate.

More precisely, the first gate may include a control gate on the substrate, and a charge storage gate between the substrate and control gate; a first dielectric layer between the charge storage gate and the substrate, and a second dielectric layer between the control gate and the charge storage gate. Furthermore, a second gate and a second selective gate symmetric to the first gate and the first selective gate may be formed in the present invention, and the first selective gate and the second selective gate share a common source.

Methods of forming the first spacer may include an inner spacer material and a first spacer material sequentially formed on the first gate and the substrate, and then the first spacer material and the inner spacer material may be etched to form the first spacer including a bottom part and a top part, and an inner spacer between the first spacer and the first gate. Methods of removing the bottom part of the first spacer may include performing a wet etching process containing dilute hydrofluoric acid (DHF) to remove the bottom part composed of oxide but preserve the top part composed of nitride.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash cell forming process, comprising:
   forming a first gate on a substrate;
   forming a first spacer on a side of the first gate, wherein the first spacer comprises a bottom part and a top part;
   removing the bottom part, thereby forming an undercut; and
   forming a first selective gate beside the first spacer and filling into the undercut.

2. The flash cell forming process according to claim 1, wherein the first gate comprises a control gate on the substrate, and a charge storage gate between the substrate and the control gate.

3. The flash cell forming process according to claim 2, wherein the first gate comprises a first dielectric layer between the charge storage gate and the substrate, and a second dielectric layer between the control gate and the charge storage gate.

4. The flash cell forming process according to claim 1, further comprising:
   forming an inner spacer between the first gate and the first spacer.

5. The flash cell forming process according to claim 4, wherein the step of forming the first spacer comprises:
   blanketly and sequentially covering an inner spacer material and a first spacer material on the first gate and the substrate; and
   etching the first spacer material and the inner spacer material to form the first spacer and the inner spacer, wherein the first spacer comprises the bottom part and the top part.

6. The flash cell forming process according to claim 4, wherein the bottom part has the same material as the inner spacer.

7. The flash cell forming process according to claim 1, wherein the bottom part and the top part have different materials.

8. The flash cell forming process according to claim 7, wherein the top part comprises nitride and the bottom part comprises oxide.

9. The flash cell forming process according to claim 1, wherein the method of removing the bottom part comprises performing a wet etching process containing dilute hydrofluoric acid (DHF).

10. The flash cell forming process according to claim 1, wherein the step of forming the first selective gate comprises:
    covering a selective gate material on the first gate and the substrate; and
    planarizing the selective gate material until the first gate is exposed, and patterning the selective gate material, thereby forming the first selective gate.

11. The flash cell forming process according to claim 1, further comprising:
    forming a second gate on the substrate while forming the first gate on the substrate;

forming a second spacer comprising a top part and a bottom part on a side of the second gate corresponding to the first gate while forming the first spacer on the side of the first gate;

removing the bottom part beside the second gate while removing the bottom part, thereby forming an undercut beside the second gate; and forming a second selective gate beside the second spacer and filling the undercut beside the second gate while forming the first selective gate.

12. The flash cell forming process according to claim 11, wherein the step of forming the first selective gate and the second selective gate comprises:

blanketly covering a selective gate material on the first gate, the second gate and the substrate; and planarizing the selective gate material until exposing the first gate and the second gate, and patterning the selective gate material, thereby forming the first selective gate and the second selective gate.

13. The flash cell forming process according to claim 12, wherein the step of patterning the selective gate material comprises:

removing the selective gate material between the first gate and the second gate.

14. The flash cell forming process according to claim 1, further comprising:

forming a source/drain beside the first gate and the first selective gate after the first selective gate is formed.

15. A flash cell, comprising:

a first gate disposed on a substrate;

a first spacer disposed on a side of the first gate, wherein the first spacer has an undercut at a bottom part, thereby exposing the substrate; and a first selective gate disposed beside the first spacer and extending to the undercut.

16. The flash cell according to claim 15, wherein the first gate comprises a control gate on the substrate, and a charge storage gate between the substrate and the control gate.

17. The flash cell according to claim 16, wherein the first gate comprises a first dielectric layer between the charge storage gate and the substrate, and a second dielectric layer between the control gate and the charge storage gate.

18. The flash cell according to claim 17, wherein the first dielectric layer, the charge storage gate and the second dielectric layer constitute an oxide/nitride/oxide layer.

19. The flash cell according to claim 15, further comprising:

an inner spacer disposed between the first gate and the first spacer, wherein the first spacer has a material different from the inner spacer.

20. The flash cell according to claim 15, wherein the first spacer comprises a multilayer spacer.

* * * * *